United States Patent
Fang et al.

(10) Patent No.: US 10,833,104 B2
(45) Date of Patent: Nov. 10, 2020

(54) ARRAY SUBSTRATE AND ITS FABRICATING METHOD, DISPLAY DEVICE

(71) Applicant: BOE TECHNOLOGY GROUP CO., LTD., Beijing (CN)

(72) Inventors: Jingang Fang, Beijing (CN); Youngsun Song, Beijing (CN); Hongda Sun, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 311 days.

(21) Appl. No.: 15/745,773

(22) PCT Filed: Jul. 20, 2017

(86) PCT No.: PCT/CN2017/093613
§ 371 (c)(1),
(2) Date: Jan. 18, 2018

(87) PCT Pub. No.: WO2018/133352
PCT Pub. Date: Jul. 26, 2018

(65) Prior Publication Data
US 2020/0083258 A1    Mar. 12, 2020

(30) Foreign Application Priority Data

Jan. 23, 2017  (CN) .......................... 2017 1 0049386

(51) Int. Cl.
*H01L 27/12*   (2006.01)
*H01L 29/66*   (2006.01)
*H01L 29/786*  (2006.01)

(52) U.S. Cl.
CPC ........ *H01L 27/1225* (2013.01); *H01L 27/124* (2013.01); *H01L 27/127* (2013.01); *H01L 29/66969* (2013.01); *H01L 29/78693* (2013.01)

(58) Field of Classification Search
CPC ......... H01L 29/78633; H01L 29/41733; H01L 27/1214; H01L 27/1259; H01L 29/786;
(Continued)

(56) References Cited

U.S. PATENT DOCUMENTS 9,331,105 B2    5/2016  Wang
2007/0159565 A1*  7/2007  Segawa ............. G02F 1/136209
349/38
(Continued)

FOREIGN PATENT DOCUMENTS

CN    101000914 A    7/2007
CN    104091807 A    10/2014
(Continued)

OTHER PUBLICATIONS

International Search Report dated Oct. 26, 2017, issued in counterpart International Application No. PCT/CN2017/093613 (12 pages).
(Continued)

*Primary Examiner* — Duy T Nguyen
(74) *Attorney, Agent, or Firm* — Westerman, Hattori, Daniels & Adrian, LLP (57) ABSTRACT

The present disclosure provides a fabricating method of an array substrate, comprising: forming a pattern comprising a light shading member; spreading an organic material solution; solidifying the organic material solution, to form a buffer layer; forming a pattern of an active layer on the buffer layer, wherein a position of the active layer corresponds to a position of the light shading member; and forming a gate pattern, where the gate pattern is located on the active layer and is insulated from the active layer. Correspondingly, the present disclosure further provides an array substrate and a display device.

7 Claims, 5 Drawing Sheets

(58) Field of Classification Search
CPC .............. H01L 27/3262; H01L 27/3272; H01L 21/28247; H01L 51/5234; H01L 51/5209; H01L 27/1218; H01L 27/1225; H01L 27/124; H01L 27/1248; H01L 27/1262; H01L 27/127; H01L 29/66969; H01L 29/78603; H01L 29/78693
USPC ........................................................ 438/151
See application file for complete search history.

(56) References Cited

U.S. PATENT DOCUMENTS

| | | | |
|---|---|---|---|
| 2010/0025639 A1* | 2/2010 | Ogi | B22F 1/0062 252/514 |
| 2013/0328043 A1* | 12/2013 | Lee | H01L 33/0041 257/43 |
| 2016/0300637 A1* | 10/2016 | Mueller-Meskamp | H01B 1/02 |

FOREIGN PATENT DOCUMENTS

| | | |
|---|---|---|
| CN | 105826249 A | 8/2016 |
| CN | 105932067 A | 9/2016 |
| CN | 106158882 A | 11/2016 |
| CN | 205789970 U | 12/2016 |
| KR | 10-2015-0027434 A | 3/2015 |

OTHER PUBLICATIONS

Office Action dated Apr. 21, 2020, issued in counterpart CN Application No. 201710049386.9, with English translation (11 pages).

* cited by examiner

ARRAY SUBSTRATE AND ITS FABRICATING METHOD, DISPLAY DEVICE

CROSS-REFERENCE TO RELATED APPLICATION

This application claims priority to Chinese Patent Application No. 201710049386.9, filed Jan. 23, 2017, the contents of which are incorporated by reference in the entirety.

TECHNICAL FIELD

The present disclosure relates to the technical field of displaying, and particularly to an array substrate and its fabricating method, display device.

BACKGROUND

There are mainly two types of the structures of thin film transistors of array substrates: bottom gate type and top gate type. Compared with the bottom gate type, in the top gate type thin film transistors, the source and drain electrodes and the gate have no overlap therebetween, which can decrease parasitic capacitance, reduce signal delay and distortion, and improve the displaying effect, so as to enable the top gate type thin film transistors to be extensively applied. In addition, in order to increase the mobility of thin film transistors and reduce the drain current, the active layer may be fabricated by using amorphous oxides such as indium gallium zinc oxide (IGZO).

SUMMARY

The present disclosure aims at solving at least one of the technical problems of the prior art, and provides an array substrate and its fabricating method, display device, to reduce the breakage of the gate metal layer.

In order to solve one of the above technical problems, the present disclosure provides a fabricating method of an array substrate. The fabricating method may include: forming a pattern comprising a light shading member on a transparent substrate; spreading an organic material solution at least partially on the light shading member; solidifying the organic material solution, to form a buffer layer on the light shading member; forming a pattern of an active layer on the buffer layer, wherein a position of the active layer is above the light shading member; and forming a gate pattern, wherein the gate pattern is located on the active layer and is insulated from the active layer.

Optionally, the organic material solution includes an organic silica glass solution.

Optionally, the step of spreading the organic material solution is conducted by using a spin coating procedure.

Optionally, the step of solidifying the organic material solution is conducted by using thermal solidification, wherein a temperature of the thermal solidification is between 220° C.-250° C.

Optionally, the active layer includes a channel region that is corresponding to the gate and a source contact region and a drain contact region that are located on two sides of the channel region. After the step of solidifying the organic material solution, to form a buffer layer, the method may further include: forming a first via hole on the buffer layer, to expose part of the light shading member.

After the step of forming the gate pattern, the method may further include: forming an interlayer dielectric layer; forming on the interlayer dielectric layer a second via hole, a third via hole and a fourth via hole that penetrate throughout the interlayer dielectric layer; wherein, the second via hole exposes at least part of the source contact region, the third via hole exposes at least part of the drain contact region, and a position of the fourth via hole corresponds to a position of the first via hole, to expose part of the light shading member; and forming a pattern comprising a source and a drain, wherein the source is connected to the source contact region by the second via hole, and the drain is connected to the drain contact region by the third via hole, and is connected to the light shading member by the fourth via hole.

Optionally, the organic silica glass solution contains a photosensitive material. The step of forming a first via hole on the buffer layer may include: conducting exposure and development to the buffer layer, to form the first via hole.

Optionally, between the step of forming a gate pattern and the step of forming the interlayer dielectric layer, the method may further include: performing conductive treatment to the source contact region and the drain contact region.

Optionally, the material forming the active layer includes an amorphous oxide semiconductor; and the step of performing conductive treatment to the source contact region and the drain contact region may include:

introducing any one of $NH_3$, $N_2$ and $H_2$ gasses into a process chamber, to cause the source contact region and the drain contact region that are not covered by the gate to be conductive.

Correspondingly, the present disclosure further provides an array substrate, wherein the array substrate is fabricated by using the above fabricating method that is provided by the present disclosure.

Correspondingly, the present disclosure further provides a display device, comprising the above array substrate that is provided by the present disclosure.

The present disclosure forms the buffer layer between the step of forming the light shading member and the step of forming the active layer, and, when fabricating the buffer layer, firstly spread the layer of the organic material solution and then solidifies it. Because the organic material solution has a good fluidity, the surface of the buffer layer that is formed by the solidification of the organic material solution is flatter, and in subsequently depositing the gate metal layer to fabricate the gate and the gate line, the positions of the gate metal layer that are corresponding to the edges of the light shading member do not easily have breakage, thereby ensuring that the thin film transistor can receive the signal of the gate line and improving the quality of the array substrate.

BRIEF DESCRIPTION OF THE DRAWINGS

The drawings are intended to provide a further understanding of the present disclosure, and constitute part of the description. The drawings are intended to interpret the present disclosure along with the following particular embodiments, and do not function to limit the present disclosure. In the drawings.

In the drawings, the reference numbers are.

1, the active layer; 2, the light shading member; 3, the gate; 4, the gate line;

10, the substrate; 11, the light shading member of the present disclosure; 12, the buffer layer; 13, the active layer of the present disclosure; 131, the channel region; 132, the source contact region; 133, the drain contact region; 14, the gate insulating layer; 15, the gate of the present disclosure; 16, the interlayer dielectric layer; 17, the source; 18, the drain; 19, the passivation layer; 20, the planarization layer; 21, the electrode; 22, the pixel defining layer; V1, the first via hole; V2, the second via hole; V3, the third via hole; V4, the fourth via hole; and V5, the fifth via hole.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples of the present disclosure. Also, common but well-understood elements that are useful or necessary in a commercially feasible example are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an example is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

The particular embodiments of the present disclosure will be described in detail below by referring to the drawings. It should be understood that, the particular embodiments described herein are merely intended to illustrate and explain the present disclosure, but are not to limit the present disclosure.

Figure 1:
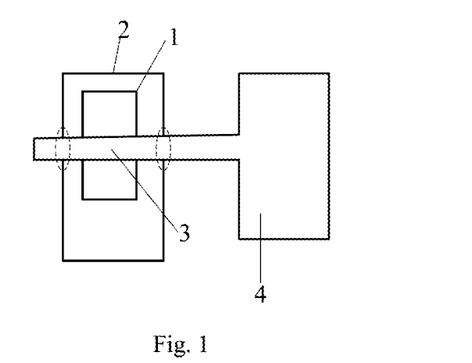
FIG. 1 is the schematic diagram of breakage positions of the gate metal layer in the prior art.

Because amorphous oxides are sensitive to irradiation, in order to ensure the performance of top gate type thin film transistors, a light shading member 2 is provided under the active layer 1 as shown by FIG. 1. In order to prevent excessive contact resistance that is caused by over-etching in dry etching, the light shading member 2 may be made relatively thick. After the light shading member 2 is completed, its edges may have obvious steps. Therefore, when the gate 3 and the gate line 4 connected to the gate 3 are being formed, the gate metal layer at the edges of the light shading member 2 (within the broken line circles in FIG. 1) may be easily broken, which results in that thin film transistor cannot receive the signal and thus gets out of service. Thus, there is a need for a better array substrate to address the above issues.

In an aspect of the present disclosure, there is provided a fabricating method of an array substrate. The method may include: forming a pattern comprising a light shading member on a transparent substrate; spreading an organic material solution at least partially on the light shading member; solidifying the organic material solution, to form a buffer layer on the light shading member; forming a pattern of an active layer comprising a thin film transistor on the buffer layer, wherein a position of the active layer is above the light shading member; and forming a pattern comprising a gate of the thin film transistor, wherein the gate is located on the active layer and is insulated from the active layer.

When a buffer layer is formed by using chemical vapor deposition process, a buffer layer of a uniform thickness will be obtained; that is, the surface of the buffer layer still has obvious segment gaps at the positions that are corresponding to the edges of the light shading member. However, the fabricating method of array substrate that is provided by the present disclosure firstly spreads the layer of the organic material solution, and then solidifies it. Because the organic material solution has a good fluidity, the surface of the buffer layer that is formed by the solidification of the organic material solution is flatter, and in subsequently depositing the gate metal layer to fabricate the gate and the gate line, the positions of the gate metal layer that are corresponding to the edges of the light shading member do not easily have breakage, thereby ensuring that the thin film transistor can receive the signal of the gate line and improving the quality of the array substrate.

Figure 2:
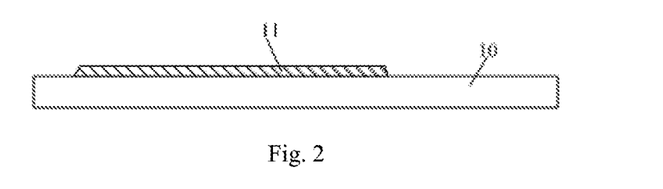
FIG. 2 is a schematic diagram that illustrates a structure after the fabrication step of forming a pattern comprising a light shading member.
Figure 13:
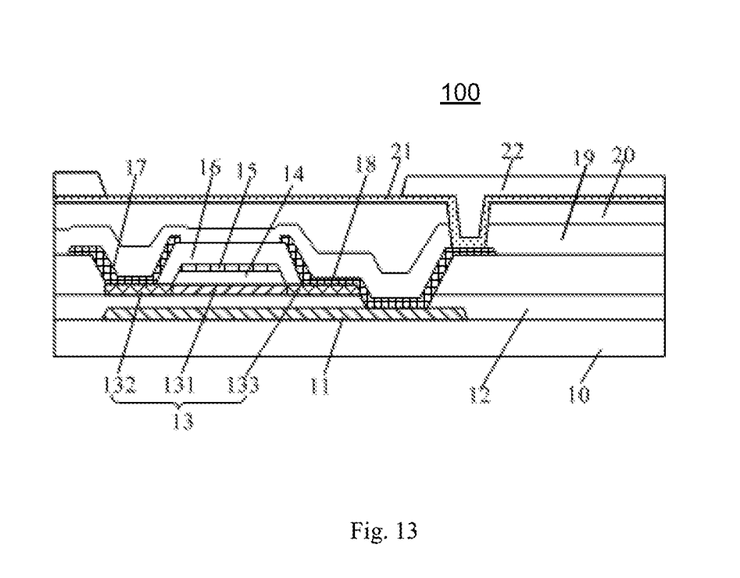
FIG. 13 is a schematic diagram that illustrates a structure after the fabrication step of forming a pixel defining layer.
Figure 14:
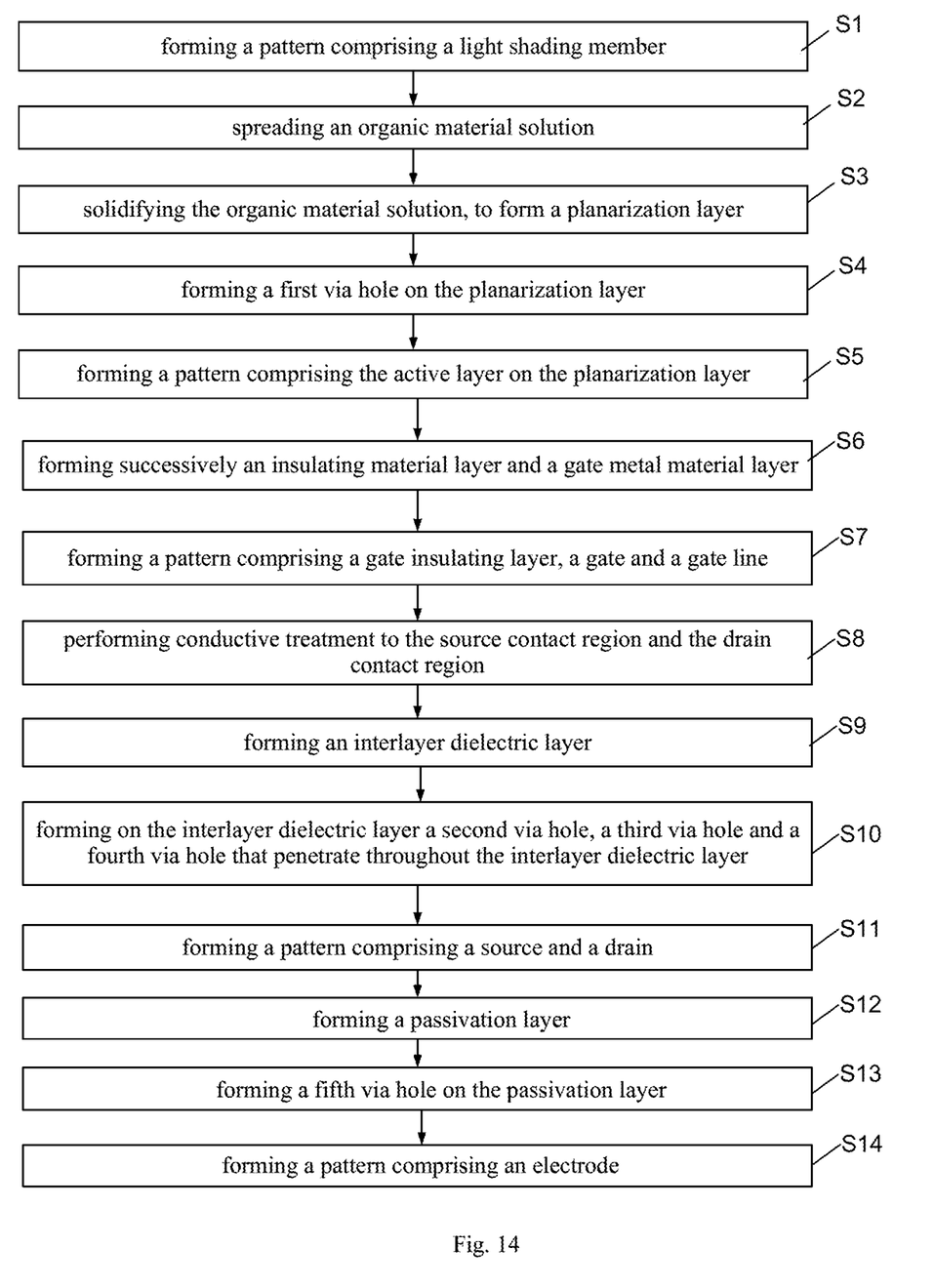
FIG. 14 is the flow chart of the fabricating method of the array substrate that is provided by the embodiments of the present disclosure.

FIG. 14 is the flow chart of the fabricating method of an array substrate that is provided by the present disclosure. FIG. 2 to FIG. 13 give the schematic diagram of the structures that are corresponding to the steps. Referring to FIGS. 2 to 14, the fabricating method includes:

S1, as shown by FIG. 2, forming a pattern comprising a light shading member 11. The step may include: providing a transparent substrate 10, wherein the substrate may be a 50 nm-1000 nm thick Corning glass or Asahi Glass, and so on, such as quartz glass; forming a light shading material layer on the substrate 10 by sputtering process, wherein the light shading material layer may particular be a metal layer; and then conducting photolithography pattern forming process to the light shading material layer, thereby forming the pattern comprising the light shading member 11.

S2, spreading an organic material solution at least partially on the light shading member 11, wherein the spreading mode may particularly be spin coating procedure, so as to enable the organic material solution to be spread more uniformly. The organic material solution may also be spread at least partially on the transparent substrate 10. The organic material solution particularly includes an organic silica glass solution that contains a photosensitive material. Organic silicon materials have good high temperature resistance, and the transparence after high temperature solidification is good.

S3, solidifying the organic material solution, to form a buffer layer 12 on the light shading member 11. The solidification mode may be thermal solidification, wherein the temperature of the thermal solidification is between 220° C.-250° C., and the duration is approximately 1 h. By regulating the parameters of the organic silica glass solution such as the concentration and the spreading thickness, the thickness of the buffer layer 12 is made between 300 nm-500 nm. The organic silica glass solution, after the solidification, foil is a compact silicon oxide, thereby improving the adhesive force of the subsequently fabricated active layer 13 on the substrate 10, and preventing the potassium and sodium ions on the substrate 10 from diffusing into the active layer under the condition of high temperature annealing, to in turn ensure the favorable characteristics of the thin film transistor.

It should be noted that, containing the photosensitive material in the organic silica glass solution is in order to facilitate subsequently forming the via hole on the buffer layer 12.

Figure 3:
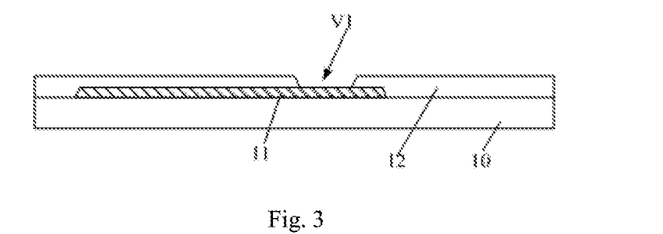
FIG. 3 is a schematic diagram that illustrates a structure after the fabrication step of forming a first via hole V1 on the buffer layer.
Figure 9:
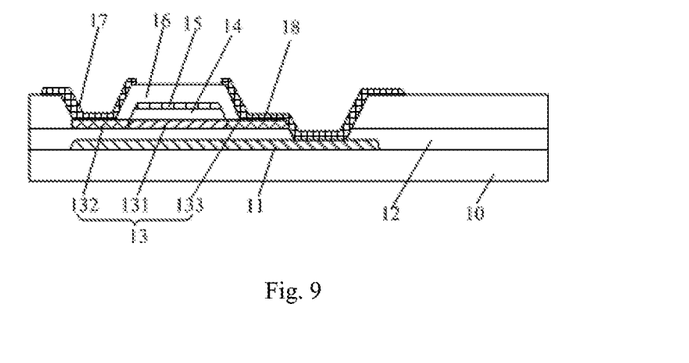
FIG. 9 is a schematic diagram that illustrates a structure after the fabrication step of forming the source and the drain.

After Step S3, the method further includes:

S4, forming a first via hole V1 on the buffer layer 12, as shown by FIG. 3, to expose part of the light shading member 11. The object to form the first via hole V1 is to, when the drain 18 is formed subsequently (as shown by FIG. 9), connect the drain 18 and the light shading member 11, to prevent the phenomenon of the non-convergence of the I-V curve of the thin film transistor that is caused by the floating of the light shading member 11. Because the materials forming the buffer layer 12 further include the sensitive material, Step S4 particularly includes: conducting exposure and development to the buffer layer 12, to form the first via hole V1. In this way, the first via hole V1 can be formed without etching, thereby simplifying the process.

Figure 4:
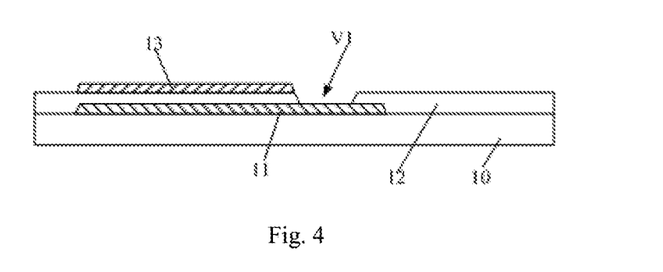
FIG. 4 is a schematic diagram that illustrates a structure after the fabrication step of forming a pattern comprising the active layer on the buffer layer.

S5, as shown by FIG. 4, forming a pattern comprising the active layer 13 on the buffer layer 12. The step may include:

forming a semiconductor material layer, wherein the semiconductor material may be any one of the amorphous oxide semiconductors IGZO, ZnON and ITZO; and then conducting photolithography pattern forming process to the semiconductor material layer, to form a pattern comprising the active layer 13. In that, as shown by FIG. 5 and FIG. 9, the active layer 13 includes a channel region 131 that is corresponding to the gate 15 and a source contact region 132 and a drain contact region 133 that are located on the two sides of the channel region 131, wherein the source contact region 132 is the portion to be contacted with the source 17, and the drain contact region 133 is the portion to be contacted with the drain 18.

S6, forming successively an insulating material layer and a gate metal material layer, wherein the insulating material layer may be a silicon nitride, a silicon oxide and so on, and the gate metal material layer may be any one of the metals aluminum (Al), molybdenum (Mo), chromium (Cr), copper (Cu) and titanium (Ti), with a thickness between 200 nm-1000 nm.

Figure 5:
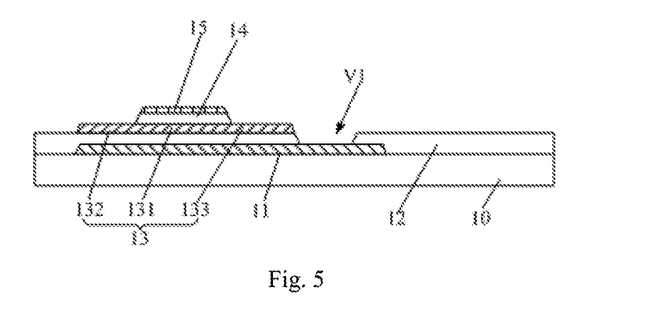
FIG. 5 is a schematic diagram that illustrates a structure after the fabrication step of forming a pattern comprising a gate insulating layer, a gate, and a gate line.

S7, forming by using the same photolithography pattern forming process a pattern comprising a gate insulating layer 14, the gate 15 and a gate line, as shown by FIG. 5. Particularly, the step includes first forming a photoresist layer on the gate metal material layer; then conducting exposure and development to the photoresist layer, to reserve the photoresists at the gate 15 and the gate line and remove the photoresist at the other areas; then etching the gate metal material layer by using the wet etching process, to form a pattern comprising the gate 15 and the gate line (not shown); then etching the insulating material layer by using the dry etching process, to form a pattern comprising the gate insulating layer 14; and finally removing the residual photoresist.

It should be understood that, the thickness of the active layer 13 is small, and the segment gap between the surface of the active layer 13 and the surface of the buffer layer 12 is small, so the gate metal material layer does not break even at the edges of the active layer 13.

Figure 6:
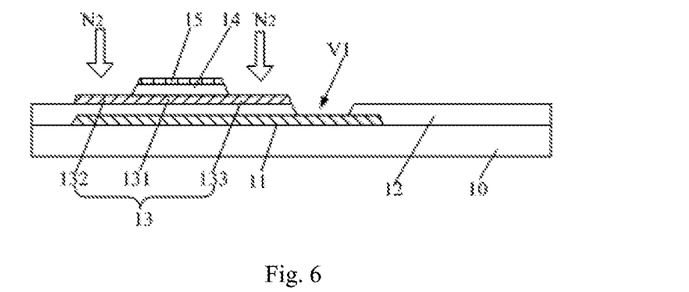
FIG. 6 is a schematic diagram that illustrates a structure after the fabrication step of exposing the source contact region and the drain contact region using gas.

S8, performing conductive treatment to the source contact region 132 and the drain contact region 133, thereby reducing the contact resistances between the active layer 13 and the source 17 and the drain 18. Step S7 may particularly include: introducing any one of $NH_3$, $N_2$ and $H_2$ gasses into the process chamber that contains the substrate, as shown by FIG. 6, to cause the source contact region 132 and the drain contact region 133 that are exposed to be conductive.

Figure 7:
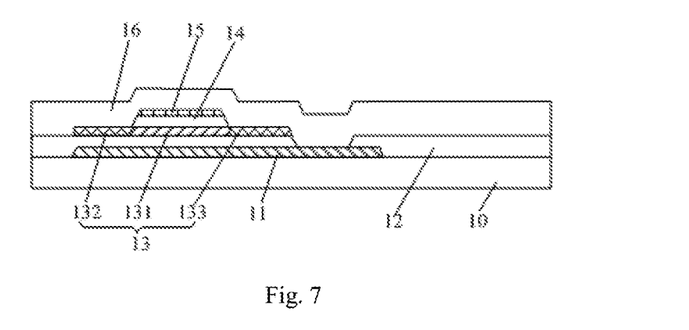
FIG. 7 is a schematic diagram that illustrates a structure after the fabrication step of forming an interlayer dielectric layer.

S9, forming an interlayer dielectric layer 16, as shown by FIG. 7. The interlayer dielectric layer 16 is any one of a silicon nitride film, a silicon oxide film and a silicon oxynitride film or a composite film of any of them. The interlayer dielectric layer 16 may be fabricated by using chemical vapor deposition, thereby obtaining the interlayer dielectric layer of a uniform thickness.

Figure 8:
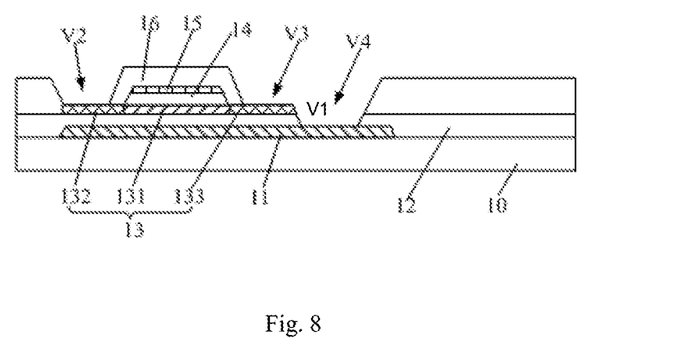
FIG. 8 is a schematic diagram that illustrates a structure after the fabrication step of forming one or more via holes on the interlayer dielectric layer.

S10, forming on the interlayer dielectric layer 16 a second via hole V2, a third via hole V3 and a fourth via hole V4 that penetrate throughout the interlayer dielectric layer 16, as shown by FIG. 8. In that, the second via hole V2 exposes at least part of the source contact region 132, the third via hole V3 exposes at least part of the drain contact region 133, and the position of the fourth via hole V4 corresponds to the position of the first via hole V1, to expose part of the light shading member 11. In other words, the first via hole V1 and the fourth via hole V4 are at the same location. As shown by FIG. 8, the third via hole V3 and the fourth via hole V4 may also be in communication.

Certainly, the step may also firstly form the second via hole, the third via hole and the fourth via hole on the interlayer dielectric layer, and then form the first via hole on the buffer layer 12. It can be understood that, the reason for doping the buffer layer 12 with the photosensitive material and forming the fourth via hole and the first via hole separately is that: the second via hole, the third via hole and the fourth via hole all penetrate throughout the interlayer dielectric layer, and thus the thicknesses that are removed when etched are the same, which facilitates the simultaneous etching. Additionally, when the first via hole is formed singly, that only needs exposure and development, and is not required to use expensive etching devices.

S11, forming a source and drain metal layer, wherein the source and drain metal layer may be aluminum (Al), molybdenum (Mo), chromium (Cr), copper (Cu) and titanium (Ti), with a thickness between 200 nm-1000 nm, and conducting photolithography pattern forming process to the source and drain metal layer, thereby forming a pattern comprising the source 17 and the drain 18, as shown by FIG. 9. The source 17 is connected to the source contact region 132 by the second via hole V2. The drain 18 is connected to the drain contact region 133 by the third via hole V3, and the drawing 18 is connected to the light shading member 11 by the fourth via hole V4. The connection between the drain 18 and the light shading member 11 can ameliorate the phenomenon of the translation of the IV curve of the thin film transistor when the source-drain voltage takes different values that is caused by the floating of the light shading member 11, thereby improving the characteristics of the thin film transistor.

Figure 10:
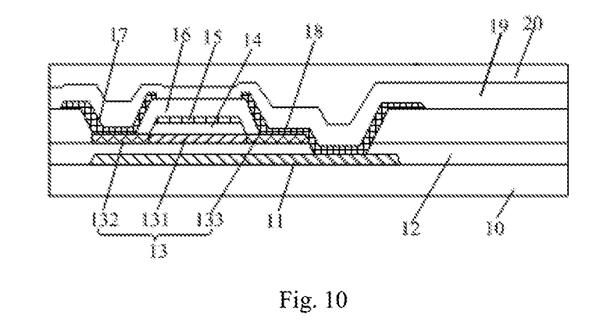
FIG. 10 is a schematic diagram that illustrates a structure after the fabrication step of forming successively a passivation layer and a planarization layer.

S12, forming successively a passivation layer 19 and a planarization layer 20, as shown by FIG. 10. The passivation layer 19 may be any one of a silicon nitride film, a silicon oxide film and a silicon oxynitride film or a composite film of any of them, and the forming method may be depositing by using Plasma Enhanced. Chemical Vapor Deposition (PECVD) process. The thickness of the passivation layer 19 is between 100 nm-500 nm. The planarization layer 20 is particularly an organic material layer, for example, a polymethyl methacrylate (PMMA) layer.

Figure 11:
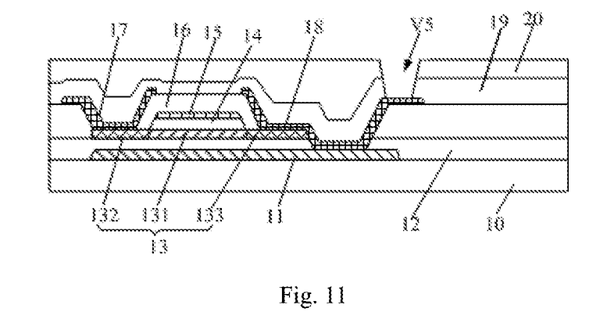
FIG. 11 is a schematic diagram that illustrates a structure after the fabrication step of forming a fifth via hole V5 that penetrates throughout the passivation layer and the planarization layer.

S13, forming a fifth via hole V5 that penetrates throughout the passivation layer 19 and the planarization layer 20, wherein the position of the fifth via hole V5 corresponds to the position of the drain 18, as shown by FIG. 11.

Figure 12:
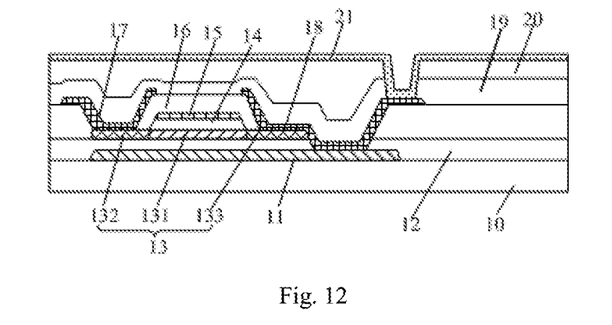
FIG. 12 is a schematic diagram that illustrates a structure after the fabrication step of forming a pattern comprising an electrode.

S14, forming a pattern comprising an electrode 21, wherein the electrode 21 is connected to the drain 18 by the fifth via hole V5, as shown by FIG. 12.

The array substrate that is fabricated in the present disclosure may be applied to liquid crystal display devices, and in such a case, the electrode 21 in Step S14 is a transparent pixel electrode, and is particularly fabricated by using a transparent electrically conducting material such as indium tin oxide (ITO).

The array substrate that is fabricated in the present disclosure may also be applied to organic electroluminescence display devices, and in such a case, the electrode 21 in Step S14 may be the anode of the luminescence unit. In addition, when the organic electroluminescence display device employs a top emission structure, the electrode 21 may particularly be made by using metals of high emissivity such as aluminum (Al) and molybdenum (Mo), when the organic electroluminescence display device employs a bottom emission structure, the electrode may particularly be made by using a transparent electrically conducting material such as indium tin oxide (ITO).

It can be understood that, when the array substrate is applied to the organic electroluminescence display device, after Step S15, the method may further include: the step of forming a pixel defining layer 22 (as shown by FIG. 13) and forming a luminescence unit.

In another aspect of the present disclosure, the present disclosure provides an array substrate. The array substrate may be fabricated by using the above fabricating method. As shown by FIG. 13, the array substrate 100 includes a substrate 10, a light shading member 11 provided on the substrate 10 and a thin film transistor. The thin film transistor includes an active layer 13 and a gate 15. The gate 15 is located on the active layer 13 and is insulated spaced from the active layer 13. For example, the gate 15 may be spaced from the active layer 13. Here, the active layer 13 is located on the light shading member 11. The active layer 13 and the light shading member 11 are provided with a buffer layer 12 therebetween. The buffer layer 12 is formed by the solidification of an organic material solution. In that, the organic material solution includes an organic silica glass solution that contains a sensitive material. By the solidification of the organic material solution, the method can make the surface of the buffer layer 12 flatter, which prevents the phenomenon of breakage of the gate metal layer, and improves the quality of the array substrate.

In still another aspect of the present disclosure, the present disclosure provides a display device, comprising the above array substrate that is provided by the present disclosure. Because the surface of the buffer layer of the array substrate is flatter, which prevents the phenomenon of breakage of the gate metal layer, the display device that employs the array substrate has better quality.

It can be understood that, the above embodiments are merely exemplary embodiments employed for illustrating the principle of the present disclosure, and the present disclosure is not limited thereto. For a person skilled in the art, various modifications and improvements can be made without departing from the spirit and nature of the present disclosure, and those modifications and improvements fall within the protection scope of the present disclosure.

What is claimed is:

1. A method for fabricating an array substrate, comprising:
    forming a pattern comprising a light shading member on a transparent substrate;
    spreading an organic material solution at least partially on the light shading member;
    solidifying the organic material solution, to form a buffer layer on the light shading member;
    forming a first via hole on the buffer layer, to expose part of the light shading member;
    forming a pattern of an active layer on the buffer layer, wherein the active layer is above the light shading member; and
    forming a gate pattern, wherein the gate pattern is disposed on the active layer and is insulated from the active layer,
    wherein the active layer comprises a channel region that corresponds to the gate pattern and a source contact region and a drain contact region that are located on two sides of the channel region, and after the step of forming the gate pattern, the method further comprises:

forming an interlayer dielectric layer;

forming on the interlayer dielectric layer a second via hole, a third via hole and a fourth via hole that penetrate throughout the interlayer dielectric layer; wherein, the second via hole exposes at least part of the source contact region, the third via hole exposes at least part of the drain contact region, and a position of the fourth via hole corresponds to a position of the first via hole, to expose part of the light shading member; and forming a pattern comprising a source and a drain, wherein the source is connected to the source contact region by the second via hole, and the drain is connected to the drain contact region by the third via hole, and is connected to the light shading member by the fourth via hole.

2. The fabricating method according to claim 1, wherein the organic material solution comprises an organic silica glass solution.

3. The fabricating method according to claim 2, wherein, the organic silica glass solution contains a photosensitive material; and the step of forming the first via hole on the buffer layer comprises:

conducting exposure and development to the buffer layer, to form the first via hole.

4. The fabricating method according to claim 1, wherein spreading the organic material solution is conducted by using a spin coating procedure.

5. The fabricating method according to claim 1, wherein solidifying the organic material solution is conducted by using thermal solidification, wherein a temperature of the thermal solidification is between 220° C.-250° C.

6. The fabricating method according to claim 1, wherein between the step of forming the gate pattern and the step of forming the interlayer dielectric layer, the method further comprises:

performing conductive treatment to the source contact region and the drain contact region.

7. The fabricating method according to claim 6, wherein the material forming the active layer comprises an amorphous oxide semiconductor; and wherein performing conductive treatment to the source contact region and the drain contact region comprises:

introducing any one of $NH_3$, $N_2$ and $H_2$ gasses into a process chamber, to cause the source contact region and the drain contact region that are not covered by the gate to be conductive.

* * * * *